(12) United States Patent
Kunita

(10) Patent No.: US 7,733,427 B2
(45) Date of Patent: Jun. 8, 2010

(54) TELEVISION RECEIVING TUNER AND TELEVISION RECEIVER

(76) Inventor: Yoshiyuki Kunita, c/o Funai Electric Co., Ltd. 7-1, 7-chome Nakagaito, Daito-shi, Osaka (JP) 574-0013

( * ) Notice: Subject to any disclaimer, the term of this patent is extended or adjusted under 35 U.S.C. 154(b) by 1216 days.

(21) Appl. No.: 11/298,642

(22) Filed: Dec. 8, 2005

(65) Prior Publication Data

US 2006/0128327 A1  Jun. 15, 2006

(30) Foreign Application Priority Data

Dec. 15, 2004 (JP) ............................. 2004-363218

(51) Int. Cl.
*H04N 5/44* (2006.01)
*H04N 5/50* (2006.01)

(52) U.S. Cl. ................. 348/731; 348/569; 348/570; 348/732; 348/734

(58) Field of Classification Search ................ 348/569, 348/570, 731, 732, 734
See application file for complete search history.

(56) References Cited

U.S. PATENT DOCUMENTS

| | | | | |
|---|---|---|---|---|
| 4,959,720 A | * | 9/1990 | Duffield et al. | 725/57 |
| 5,045,947 A | * | 9/1991 | Beery | 725/57 |
| 5,315,392 A | * | 5/1994 | Ishikawa et al. | 725/56 |
| RE35,952 E | * | 11/1998 | Beery | 348/731 |
| 5,844,633 A | * | 12/1998 | Kim | 725/56 |
| 5,963,269 A | * | 10/1999 | Beery | 348/570 |
| 6,313,886 B1 | * | 11/2001 | Sugiyama | 348/731 |
| 6,396,549 B1 | * | 5/2002 | Weber | 348/734 |
| 6,661,472 B2 | * | 12/2003 | Shintani et al. | 348/732 |
| 6,704,062 B1 | * | 3/2004 | Ashida | 348/731 |
| 6,707,508 B1 | * | 3/2004 | Mears et al. | 348/731 |
| 6,766,526 B1 | * | 7/2004 | Ellis | 725/57 |
| 6,782,549 B1 | * | 8/2004 | Hasegawa | 725/38 |
| 6,803,874 B1 | * | 10/2004 | Weber | 341/176 |
| 7,057,673 B1 | * | 6/2006 | Weber | 348/734 |
| 7,224,409 B2 | * | 5/2007 | Chin et al. | 348/732 |
| 2002/0078442 A1 | * | 6/2002 | Reyes et al. | 725/25 |
| 2002/0104103 A1 | * | 8/2002 | Takagi et al. | 725/151 |
| 2005/0183135 A1 | * | 8/2005 | Uchida et al. | 725/135 |
| 2006/0101498 A1 | * | 5/2006 | Arling et al. | 725/81 |
| 2008/0259213 A1 | * | 10/2008 | Yoshida et al. | 348/521 |

FOREIGN PATENT DOCUMENTS

| | | |
|---|---|---|
| JP | 10-336532 | 12/1998 |
| JP | 2000-069382 | 3/2000 |

* cited by examiner

*Primary Examiner*—Brian P Yenke

(57) ABSTRACT

A television receiving tuner is provided which can smoothly designate a channel number, while preventing an unwanted search based on the channel number wrongly input. In the television receiving tuner, it is determined whether or not a numeric value input into one digit corresponds to any one of a plurality of channel numbers stored in a channel number data $28d1$ in designation of the channel number, based on the numeric value input into the one digit, the numeric value(s) already input into another or other digits, and an inputtable numeric value list $28d2$. If the value input is determined not to correspond to the channel number stored, a first annunciation image is displayed for announcing an inputting error of the channel number.

1 Claim, 7 Drawing Sheets

FIG. 2

| BS digital broadcasting | | BS radio broadcasting | |
|---|---|---|---|
| Broadcast station | Channel number | Broadcast station | Channel number |
| A | 101 | K | 444,445 |
| B | 102 | L | 455,456 |
| C | 103 | M | 461,462 |
| D | 141,142,143 | N | 471,472 |
| E | 151,152,153 | O | 488,489 |
| F | 161,162,163 | P | 491,492 |
| G | 171,172,173 | Q | 300,301 |
| H | 181,182,183 | R | 316,317,318,319 |
| I | 191,192,193 | S | 320,321,322,323 |
| J | 200 | T | 333 |

FIG. 3

| Numeric value inputtable into first digit | Numeric value inputtable into first and second digits | | Numeric value inputtable into third digit | | Numeric values inputtable into first and second digits | Inputtable numeric value |
|---|---|---|---|---|---|---|
| 1,2,3,4 | Numeric value inputtable into second digit | | Numeric values input into first and second digits | Inputtable numeric value | 31 | 6,7,8,9 |
| | Numeric value input into first digit | Inputtable numeric value | 10 | 1,2,3 | 32 | 0,1,2,3 |
| | 1 | 0,4,5,6,7,8,9 | 14 | 1,2,3 | 33 | 3 |
| | 2 | 0 | 15 | 1,2,3 | 44 | 4,5 |
| | 3 | 0,1,2,3 | 16 | 1,2,3 | 45 | 5,6 |
| | 4 | 4,5,6,7,8,9 | 17 | 1,2,3 | 46 | 1,2 |
| | | | 18 | 1,2,3 | 47 | 1,2 |
| | | | 19 | 1,2,3 | 48 | 8,9 |
| | | | 20 | 0 | 49 | 1,2 |
| | | | 30 | 0,1 | | |

TELEVISION RECEIVING TUNER AND TELEVISION RECEIVER

BACKGROUND OF THE INVENTION

1. Field of the Invention

The present invention relates to a television receiving tuner, and to a television receiver having a tuner function.

2. Description of the Related Art

Conventionally, television receivers have been known which receive a television broadcast radio wave corresponding to a channel number inputted, and display an image based on the radio wave received (as disclosed in, for example, JP-A-2000-69382 and JP-A-10-336532).

In recent years, digital broadcasting, such as BS digital broadcasting or BS radio broadcasting, has been put into practical use. Such digital broadcasting can provide television broadcasting with high definition and high audio quality, and radio broadcasting with high sound quality, while allowing multichannel systems by digital compression technology of video and sounds, thereby providing viewers with more programs.

In the present BS digital broadcasting or BS radio broadcasting, a channel number composed of three digits, namely, a three-digit channel number is assigned to each broadcast station. In designating a channel, numeric values for three digits of the channel number are input from a remote controller or the like. The number of digits of the channel number, namely, three, is relatively many, making it difficult for an operator to remember the channel numbers for all broadcast stations. Thus, an inputting error of the channel number tends to be caused readily. In this case, the three-digit numeric values have to be repeatedly entered many times, failing to smoothly designate the channel number. Once the wrong channel number happens to be input, an unwanted search operation is disadvantageously carried out based on the channel number wrongly input.

SUMMARY OF THE INVENTION

In view of the above-mentioned problems, it is an object of the invention to provide a television receiving tuner which can smoothly designate a channel number, while preventing an unwanted search based on the channel number wrongly input, and a television receiver using the same.

To solve the above-mentioned problems, according to one aspect of the invention, there is provided a television receiving tuner which includes a channel number storage section for storing therein a channel number having a plurality of digits, and which is adapted to receive a television broadcast radio wave in a frequency band corresponding to the channel number designated. The television receiving tuner comprises:

a digit determination section for determining whether or not a numeric value input, or each of the numeric values currently and previously input is identical to a numeric value at the corresponding digit of the channel number stored in the channel number storage section when the numeric value for any one of the digits is input in designation of the channel number; and a first announcing section for announcing an inputting error of the channel number when the numeric value input, or each of the numeric values currently and previously input is determined not to be identical to the numeric value at the corresponding digit of the channel number stored in the channel number storage section by the digit determination section.

With such an arrangement, the television receiving tuner includes the channel number storage section for storing therein the channel numbers each having a plurality of digits, and is configured to receive the television broadcast radio wave in the frequency band corresponding to the channel number designated. For example, the channel numbers, such as "311" or "234", each of which consists of the plurality of digits, are stored.

As mentioned above, the television receiving tuner comprises the digit determination section that determines whether or not the numeric value input, or each of the numeric values currently and previously input is identical to the numeric value located at the corresponding digit in the channel number stored in the channel number storage section when the numeric value for any one of the digits is input in designation of the channel number, and the first announcing section that announces an inputting error of the channel number when the numeric value input, or each of the numeric values currently and previously input is determined not to be identical to the numeric value at the corresponding digit of the channel number stored in the channel number storage section by the digit determination section. For example, for only two channel numbers "311" and "234" stored in the channel number storage section, when a value "1" is input into a first digit (a digit located at the left end), since the input value is different from both values "3" and "2" located at the first digits of the two channel number, the input value is determined not to be identical to the inputtable numeric value by the digit determination section. Such an inputting error is announced by an image, by voice or the like. Further, for example, suppose that two channel numbers "311" and "222" are only stored in the storage section and a value "3" is already input as the numeric value at the first digit. When a value "2" is entered into the second (central) digit, it is determined that the input numeric value is not identical to the inputtable value by the digit determination section, and thus this inputting error is announced because the channel number having the value "3" at the first digit is only "311" among two channel numbers, the second digit of which is "1". This can eliminate the necessity of reentering all digits of the channel numbers many times, resulting in smooth designation of the channel number. Since the inputting error is informed before the numeric values for all digits are completely entered, a search operation for a wrong channel number is avoided.

In another aspect of the invention, the television receiving tuner further comprises a reentry accepting section for accepting reentry of another numeric value into the corresponding digit when the numeric value input, or each of the numeric values currently and previously input is determined not to be identical to the numeric value at the corresponding digit of the channel number stored in the channel number storage section by the digit determination section.

With the above-mentioned arrangement, when the numeric value input into a digit in midstream is wrong in designation of the channel number having a plurality of digits, another numeric value can be reentered into the digit which the wrong value has been inputted into. This eliminates the necessity of repeatedly inputting all digits many times, resulting in improved convenience in designation of the channel number.

In another aspect of the invention, the television receiving tuner further comprises an input assistance image displaying section for displaying an inputtable numeric value when a next numeric value intends to be input into a next digit after the numeric value input, or each of the numeric values currently and previously input is determined to be identical to the numeric value at the corresponding digit of the channel number stored in the channel number storage section by the digit determination section.

With this arrangement, the inputtable numeric value into the next digit is displayed, thereby avoiding the occurrence of the inputting error.

In another aspect of the invention, the television receiving tuner further comprises a second announcing section for announcing that the input numeric value is correct when the numeric value input, or each of the numeric values currently and previously input is determined to be identical to the numeric value at the corresponding digit of the channel number stored in the channel number storage section by the digit determination section.

With this arrangement, it is possible to inform the user that the input numeric value is identical to the numeric value at the corresponding digit of the channel number stored in the channel number storage section, that is, that the input value is correct.

In another aspect of the invention, a digital television broadcast radio wave is receivable.

With this arrangement, the channel number can be smoothly designated in the BS digital broadcasting or BS radio broadcasting currently employed.

It should be noted that although the invention is directed to the television receiving tuner for receiving the television broadcast radio wave corresponding to the channel number designated, and outputting a video signal based on the broadcast radio wave to an external display or the like, the invention is not limited thereto. The arrangement of the invention may be applied to a television receiver including the above-mentioned display. That is, in another aspect of the invention, there is provided a television receiver which includes a channel number storage section for storing therein a channel number having a plurality of digits, and which is adapted to receive a television broadcast radio wave in a frequency band corresponding to the channel number designated and to display a picture based on the television broadcast radio wave. The television receiver comprises:

a digit determination section for determining whether or not a numeric value input, or each of the numeric values currently and previously input is identical to a numeric value at the corresponding digit of the channel number stored in the channel number storage section when the numeric value for any one of the digits is input in designation of the channel number; and a first announcing section for announcing an inputting error of the channel number when the numeric value input, or each of the numeric values currently and previously input is determined not to be identical to the numeric value at the corresponding digit of the channel number stored in the channel number storage section by the digit determination section.

This can smoothly designate the channel number, while preventing an unwanted search based on the channel number wrongly input.

BRIEF DESCRIPTION OF THE DRAWINGS

FIG. 2 is a diagram showing an example of data on channel numbers;

FIG. 3 is a diagram showing an example of a list of inputtable numeric values;

DESCRIPTION OF THE PREFERRED EMBODIMENTS

Reference will now be made in detail to exemplary embodiments of the invention in the following order.
(1) Inner Configuration of Television Receiving Tuner
(2) Operation of Television Receiving Tuner
(3) Various Modified Examples
(4) Conclusion

(1) Inner Configuration of Television Receiving Tuner

Now, one preferred embodiment of the invention will be described in detail below. Although in the following description the invention is applied to a television receiving tuner capable of receiving BS digital broadcasting and BS radio broadcasting, the invention is not limited thereto. The invention may be directed to a television receiving tuner capable of receiving CS broadcasting, a television receiving tuner capable of receiving digital broadcasting other than the above-mentioned broadcasting, or a television receiving tuner capable of receiving analog broadcasting. Further, the invention may also be directed to a television receiver including a display for displaying an image based on video signals output from the tuner.

Figure 1:
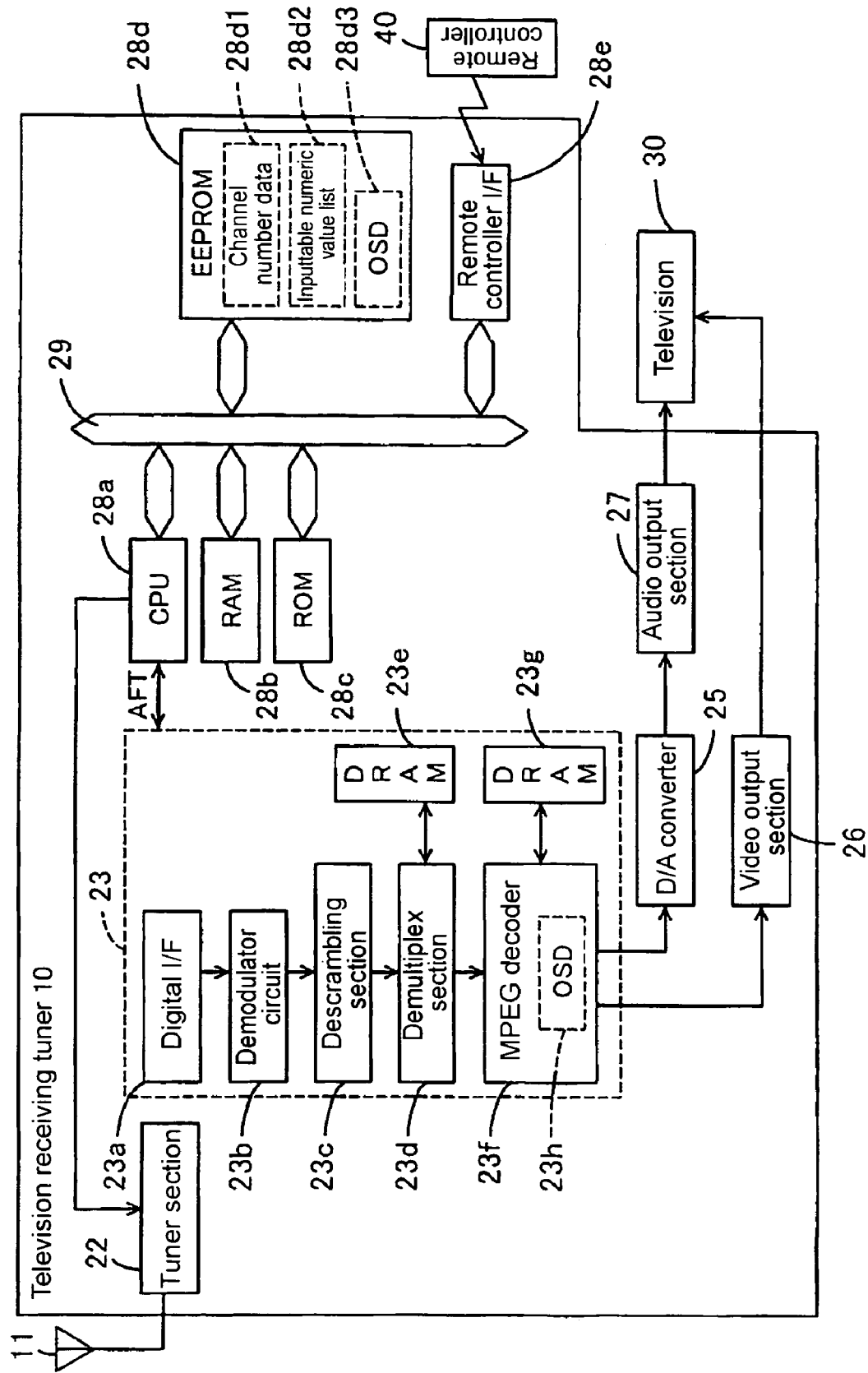
FIG. 1 is a block diagram showing a schematic configuration of a television receiving tuner.

FIG. 1 shows a schematic configuration of the television receiving tuner according to the preferred embodiment of the invention. In the figure, a television receiving tuner 10 includes a tuner section 22 into which a frequency signal is input from an antenna 11. The tuner section 22 is configured to be the so-called synthesizer type tuner, to which PLL data serving as a channel selection control signal, that is, data on frequency dividing rate of a variable frequency divider circuit in a PLL loop is fed. The tuner section 22 receives the PLL data as the channel selection control signal from a CPU 28*a*, and extracts a frequency signal with a desired frequency band from the frequency signal inputted to select a reception channel corresponding to one channel number from among a plurality of reception channels. The CPU 28*a* detects a deviation of frequency in the tuner section 22, and supplies the tuner section 22 with an AFT voltage based on the result of detection. The tuner section 22 makes an appropriate channel selection by modifying the frequency band extracted depending on the AFT voltage.

The output from the tuner section 22 is supplied to a digital reproduction section 23, which includes a digital I/F 23*a*, a demodulator circuit 23*b*, a descrambling section 23*c*, a demultiplex section 23*d*, and a MPEG decoder 23*g*. The digital I/F 23*a* to which the frequency signal is input from the tuner section 22 includes an A/D converter, and supplies the signal therefrom to a demodulating section which includes a channel equalizer, an error correction decode section, and the like.

That is, the digital I/F 23*a* and the demodulator circuit 23*b* convert the frequency signal inputted from the tuner section 22 into digital form, and perform the so-called ghost cancellation of the digital-demodulated signal based on control information from the CPU 28*a*. Also, the digital I/F 23*a* and the demodulator circuit 23*b* correct bit errors occurring on a transmission line, and provide a transport stream (TS) output.

The transport stream output provided by demodulation and error correction processing by the demodulator circuit 23*b* is supplied to the descrambling section 23*c*. Since the transport stream is normally scrambled, it cannot reproduce video and sounds appropriately as it is. Thus, the descrambling section 23c descrambles the transport stream to convert or restore it into a data array so as to reproduce the transport stream. The transport stream descrambled has a video signal, an audio signal, textual information and the like multiplexed with one another, and is supplied to the demultiplex section 23d. The demultiplex section 23d performs demultiplex processing of input data, that is, demultiplexes the multiplexed data. Note that the descrambling section 23c and the demultiplex section 23d can use a DRAM 23e as a work area in carrying out their own procedures.

The data demultiplexed by the demultiplex processing is separated or split into MPEG data including the video and audio signals compressed in a predetermined format, and data other than the video and audio signals, such as textual information regarding TV programs. The latter data is supplied to the CPU 28a, whereas the former MPEG data is supplied to a MPEG decoder 23g, which performs compression-decompression processing, namely, MPEG decode processing. In the present embodiment as mentioned above, two of the BS digital broadcasting and the BS radio broadcasting can be received, and hence the MPEG decoder 23g is capable of decompressing the MPEG data compressed in two types of formats, namely, in a MPEG-2 format employed in the BS digital broadcasting, and in a MPEG-2AAC format employed in the BS radio broadcasting. The MPEG data is MPEG-decoded to generate a digital video signal and a digital audio signal. The digital video signal generated is converted into an analog video signal by a video output section 26.

The MPEG decoder 23g includes an OSD processor 23h, and is configured to be capable of displaying an image with a predetermined still screen superimposed thereon, or replacing an image by a predetermined still image to display the image. The OSD processor 23h is capable of generating the still image based on data including the received textual information input from the CPU 28a. Note that the MPEG decoder 23g can use a DRAM 23f as a work area in carrying out the MPEG decode processing and the OSD processing.

The audio signal generated by the MPEG decode processing is input to the D/A converter 25, where it is converted into an analog audio signal. The analog audio signal is input to an audio output section 27, and output to the television 30 therefrom. It should be noted that for the television 30 including an optical input terminal or the like for allowing input of a digital audio signal, the digital audio signal may be directly output to the television 30 as it is without passing through the D/A converter 25.

The above-mentioned CPU 28a is connected to a bus 29, and executes control processing for achieving various functions of the television receiving tuner 10 using the RAM 28b connected to the bus 29 as the work area. Programs for executing the control processing are previously stored in a ROM 28c, and the CPU 28a executes the control processing, while appropriately reading the predetermined program from the ROM 28c into the RAM 28b. The bus 29 includes a rewritable EEPROM 28d, and the CPU 28a executes the control processing using various types of data stored in the EEPROM 28d.

The EEPROM 28d stores therein channel number data 28d1. The channel number data indicates channel numbers capable of being designated by an operation of the remote controller 40 or the like. FIG. 2 is a diagram showing an example of the channel number data 28d1 stored in the EEPROM 28d. As shown in the figure, in the BS digital broadcasting and the BS radio broadcasting, are respectively stored ten names of broadcast stations and channel numbers which are assigned to the respective broadcast stations. For example, a channel number 101 is assigned to a broadcast station A of the BS digital broadcasting, whereas channel numbers 444 and 445 are assigned to a broadcast station K of the BS radio broadcasting. A user designates or specifies the desired one from the channel numbers shown in FIG. 2 by operating the remote controller 40 or the like. For example, when the user intends to view the program from the broadcast station A, the user enters the numeric values "1", "0", and "1" in this order by operating a numeric keypad of the remote controller 40, and a frequency signal in a frequency band corresponding to the channel number "0" is extracted, so that the video and audio signals based on the frequency signal are generated. Note that the EEPROM 28d for storing therein the channel number data 28d1 functions as the above-mentioned channel number storage section.

The EEPROM 28d stores therein an inputtable numeric value list 28d2. The inputtable numeric value list is a list indicating numeric values inputtable into each digit of the channel number which consists of a plurality of digits. FIG. 3 illustrates an example of the inputtable numeric value list 28d2 stored in the EEPROM 28d. Note that in the following, a description will be given, also with reference to FIG. 2 described above. In FIG. 3, the numeric values inputtable into each digit are shown. The numeric value at the first digit which is first input (at the left end of the three-digit channel number) is "1", "2", "3" or "4" referring to FIG. 2. Thus, in FIG. 3, the numeric value inputtable into the first digit is any one of "1", "2", "3" or "4". The numeric value inputtable into the second digit is different depending on the numeric value already input into the first digit. For example, when the numeric value input into the first digit is "1", the numeric values inputtable to the second digit is any one of "0", "4", "5", "6", "7", "8", and "9". Further, the inputtable numeric values into the third digit are different depending on the numeric values inputted into the first and second digits. For example, when the numeric value input into the first digit is "1" and the numeric value input into the second digit is "0", the numeric values inputtable into the third digit is any one of "1", "2", and "3". Storing the numeric values inputtable into each digit of the channel number consisting of a plurality of digits in the form of list can determine readily whether or not the numeric value inputted into the digit by the remote controller 40 or the like corresponds to any one of the channel numbers stored in the EEPROM 28d.

The EEPROM 28d stores therein OSD data 28d3 for causing the above-mentioned OSD processor to perform the OSD processing. The OSD data 28d3 stored includes OSD data on a still image for announcing an inputting error of the numeric value into the digit in designating the channel number, and OSD data on a still image for announcing inputtable numeric values when a next numeric value intends to be input into a next digit after the numeric value is input into a digit.

The bus 29 is connected to the remote controller I/F 28e, and allows for input of an infrared blinking signal output from the remote controller 40 which is an external device. The infrared blinking signal is sent to the CPU 28a via the bus 29, and the CPU 28a executes the corresponding control processing. The bus 29 is connected to a bus I/F 28f for connection to the external device via a cable.

(2) Operation of Television Receiving Tuner

Now, a flow of channel switching processing performed by the television receiving tuner 10 as shown in FIG. 1 will be explained based on a flowchart of FIG. 4. First, at a step S100, a value n indicative of a digit order or rank of a numeric value input is set to 1 (n=1). This value n indicates the digit order of the numeric value input, and the numeric value input is dealt as a value input into the n-th digit in determination of the numeric value input in the following processing. Then, at a step S110, it is determined whether a numeric value is input or not. More specifically, in this step, it is determined whether or not a numeric value is input into the n-th digit of the channel number to be designated by the user using the remote controller 40. If the numeric value is determined not to be input, the operation returns to the step S110.

In contrast, when the numeric value is determined to be input at the step S110, an inputtable numeric value is read out at a next step S120. This step is carried out based on the inputtable numeric value list 28d2 shown in FIG. 3. For example, for n=1, values "1", "2", "3", and "4" are read as the numeric values inputtable into the first digit based on the inputtable numeric value list 28d2. For example, for n=2, when the numeric value input into the first digit is "1", values "0", "4", "5", "6", "7", "8" and "9" are read as the numeric values into the second digit based on the inputtable numeric value list 28d2.

After performing the processing at the step S120, then it is determined whether or not the input numeric value is identical to the inputtable numeric value at a step S130. That is, it is determined whether or not the numeric value determined to be input at the step S110 is identical to any one of the inputtable numeric values read at the step S120. In short, the processing at the step S130 involves determining whether or not the numeric value input as the n-th digit is identical to the value at the n-th digit of any one of a plurality of channel numbers stored in the channel number data 28d1. In the implementation of the processing at the step S130, the CPU 28a, RAM 28b, and EEPROM 28d act as a digit determination section.

Figure 5:
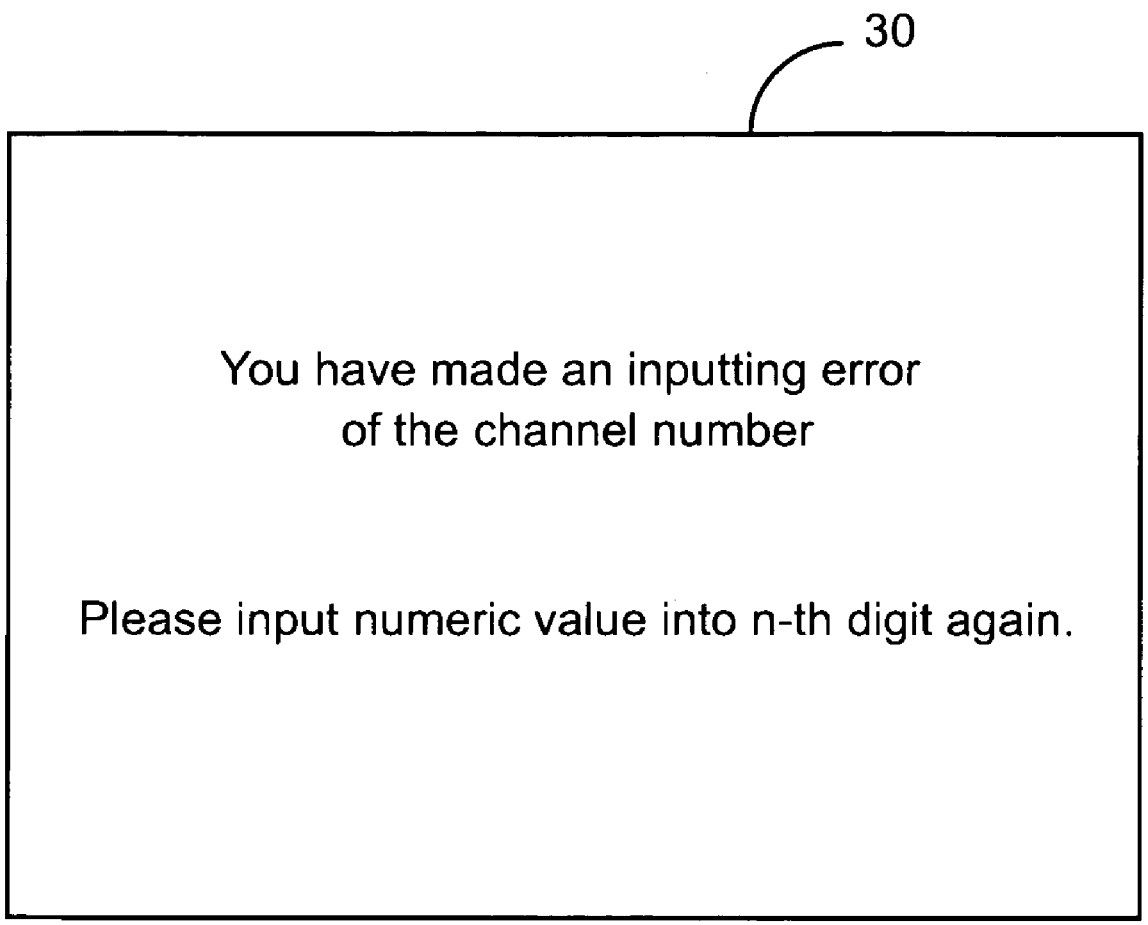
FIG. 5 is a diagram showing an example of a first annunciation image.

If the input numeric value is determined not to be identical to the inputtable numeric value at the step S130, then a first annunciation image is displayed at a step S140. In the embodiment, the display of the first annunciation image is performed in the OSD processing. FIG. 5 illustrates an example of the first annunciation image displayed at the step S140. As shown in the figure, an image indicative of the inputting error of the channel number, and an image instructing the user to input again the numeric value for the n-th digit are displayed on a display 30. In the implementation of the processing at the step S140, the CPU 28a, the OSD processor 23h, and the EEPROM 28d function as a first announcing section.

After performing the processing at the step S140, the input or entry of another numeric value is accepted at a step S150. This processing enables another numeric value to be reentered into the n-th digit. In the implementation of the processing, the CPU 28a and the remote controller I/F 28e function as a reentry accepting section. After performing the processing at the step S150, the operation returns to the step S110, and stands by until the numeric value is reentered.

Figure 6:
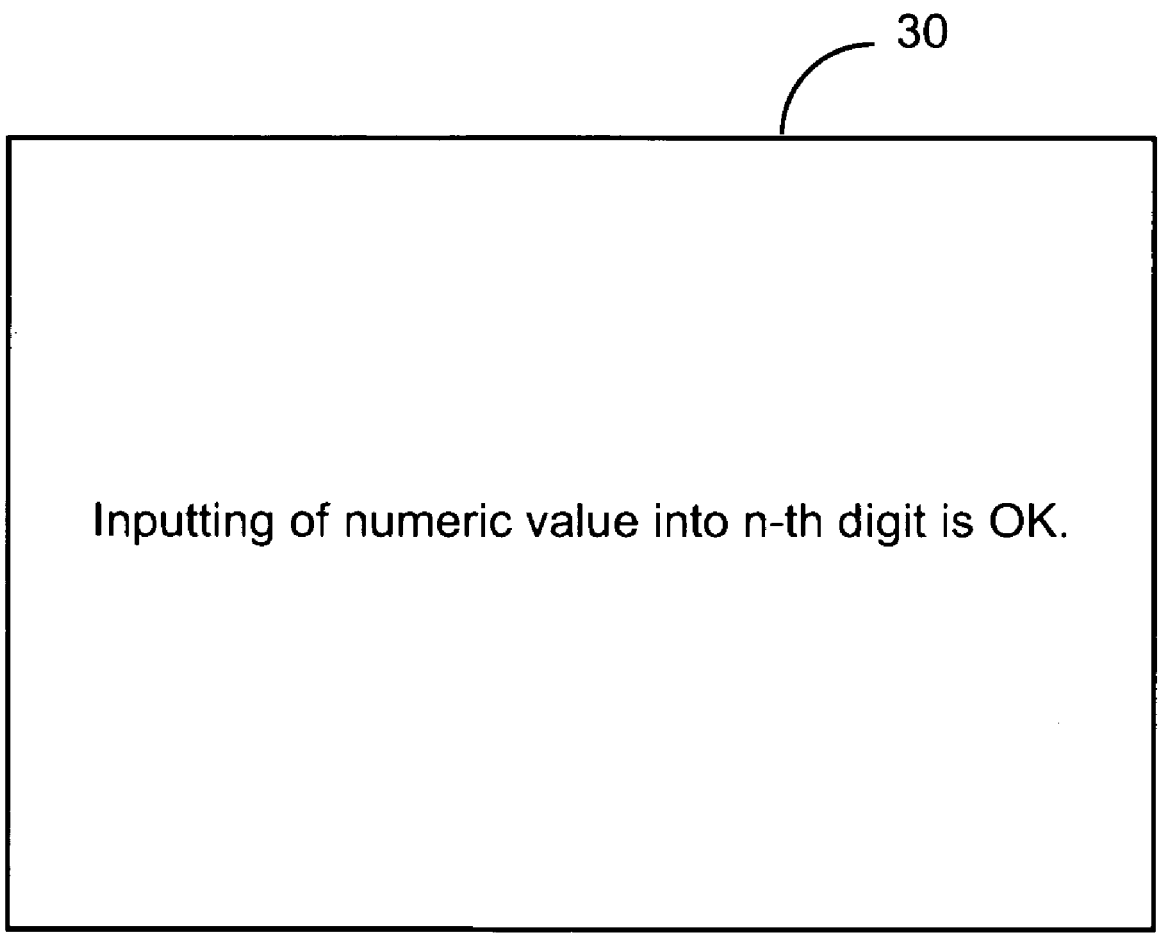
FIG. 6 is a diagram showing an example of a second annunciation image.

When the input value is determined to be identical to the inputtable numeric value at the step S130 described above, a second annunciation image is displayed at a step S160. The display of the second annunciation image is also performed in the OSD processing. FIG. 6 is a diagram showing an example of the second annunciation image displayed at the step S160. As shown in the figure, there is displayed on the display 30 an image indicating that the numeric value input into the n-th digit is identical to the inputtable numeric value and inputting of the numeric value into the n-th digit is correct. In the implementation of the processing at the step S160, the CPU 28a, the OSD processor 23h, and the EEPROM 28d function as the second announcing section.

Figure 7:
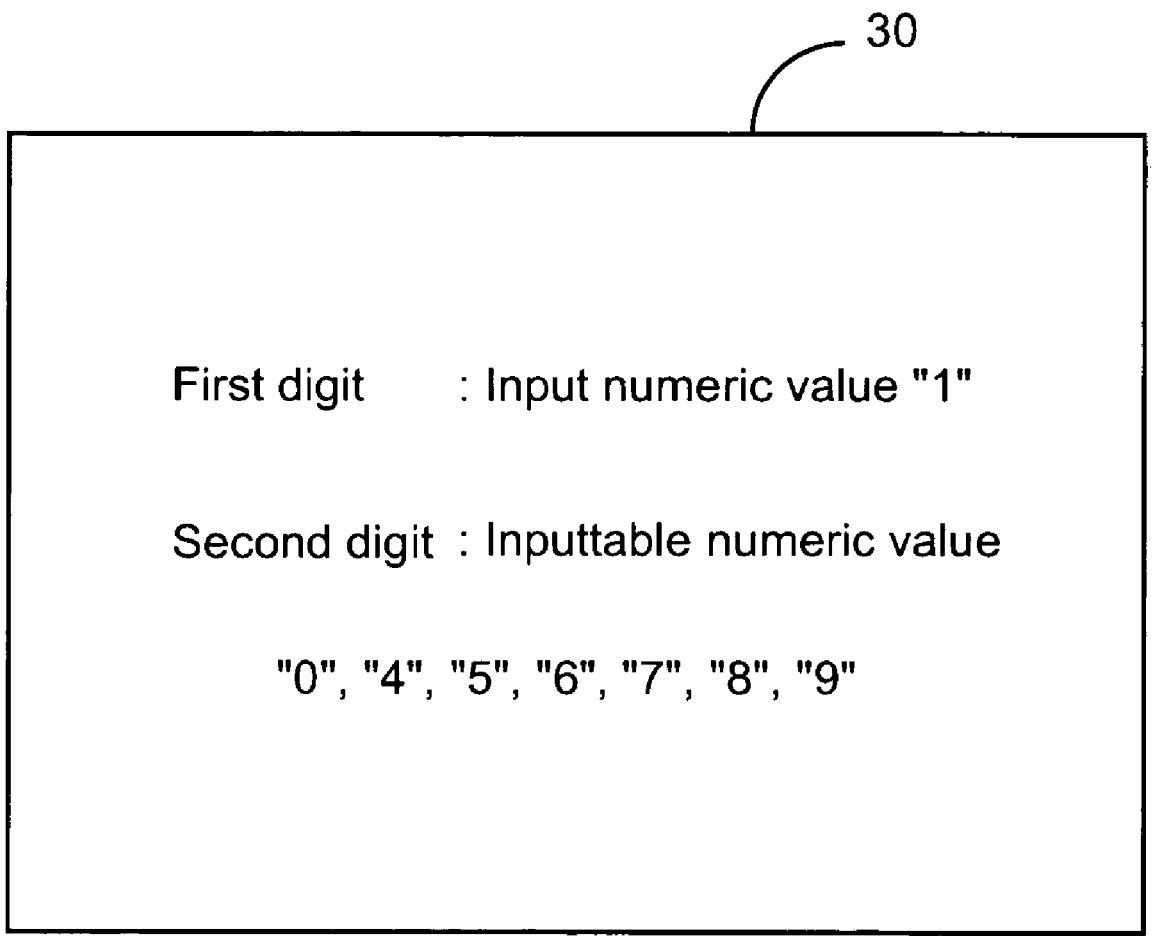
FIG. 7 is a diagram showing an example of an input assistance image.

After performing the processing at the step S160, an input assistance image is displayed at a step S170. The display of the input assistance image is also performed in the OSD processing. FIG. 7 illustrates an example of the input assistance image displayed at the step S170. In FIG. 7, for n=1, the numeric values inputtable into the second digit are shown after the numeric value for the first digit is input. As shown in FIG. 7, an image indicative of the numeric value "1" for the first digit already input is displayed at an upper part of the display 30, while a list of a series of values inputtable into the next second digit is displayed at a lower part thereof. The display of the input assistance image allows the user to understand the numeric value inputtable into the next second digit after inputting of the numeric value for the first digit, thereby preventing occurrence of the inputting errors. In the implementation of the processing at the step S170, the CPU 28a, the OSD processor 23h, and the EEPROM 28d function as an input assistance image displaying section.

After performing the processing at the step S170, the value n indicative of the digit order or rank is increased and updated by one using a formula of n=n+1 at a step S180. Then, at a step S190, it is determined whether or not the value n is larger than three (that is, the number of digits of the channel number) (n>3) If the value n is not larger than three (namely, if not n>3), that is, for n=2 or 3, then the operation returns to the step S110. If n>3, then it is determined that all three digits constituting the channel number are correctly inputted, and a search is performed for the channel number designated by completely entering the three-digit numeric value at a next step S200. More specifically, the channel number designated is searched for through the channel number data 28d1 stored in the EEPROM 28d, and the tuner section 22 is adjusted so as to extract the broadcast radio wave in the frequency band corresponding to the channel number searched for. The processing at the step S200 is performed, thereby ending the channel switching processing.

Figure 4:
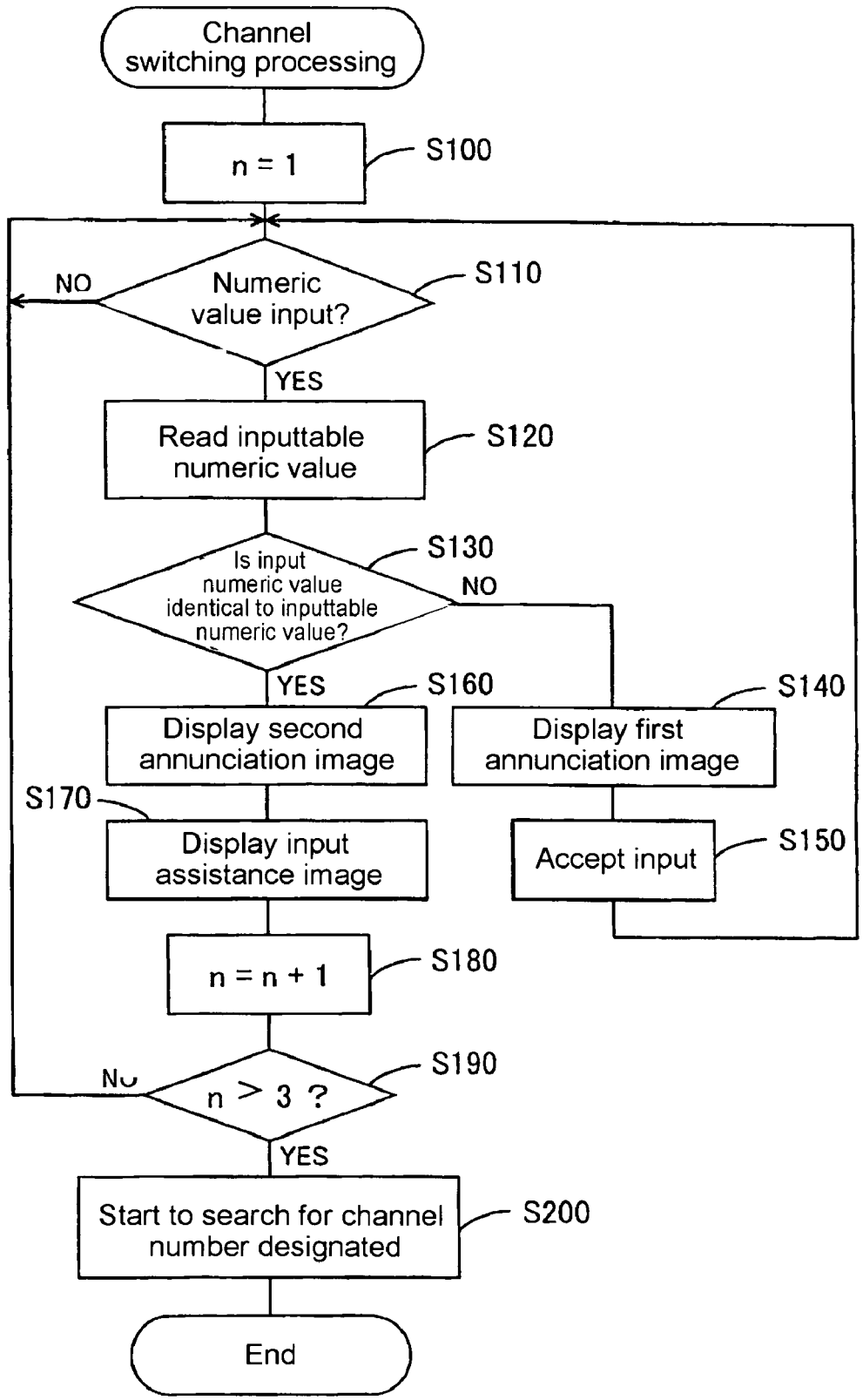
FIG. 4 is a flowchart showing a flow of channel switching processing.

Now, an exemplary example in which the channel switching processing is performed as shown in FIG. 4 will be described in detail. First, the value n is set to 1 (n=1) (step S100), and the operation stands by until the numeric value for the first digit is inputted (step S110). Note that although not shown in FIG. 4, at this time, the inputtable numeric values into the first digit may be displayed as the above-mentioned input assistance image. In this case, as shown in FIG. 3, the values "1", "2", "3", and "4" are displayed as the inputtable numeric values.

When the numeric value for the first digit is inputted, it is determined whether or not the input value is identical to the inputtable numeric value read at the step S120 (step S130). If not, the first annunciation image is displayed as shown in FIG. 5 (step S140), thereby announcing the inputting error. For example, since the values "1", "2", "3", and "4" are inputtable numeric values, when the value "5", which is not identical to the above-mentioned inputtable numeric value, is inputted as the numeric value for the first digit, the first annunciation image is displayed. After the first annunciation image is displayed, acceptance processing is performed for accepting again another numeric value for the first digit, into which the wrong numeric value has been input (step S150).

In contrast, when the input value is identical to the inputtable numeric value and thus the input is determined to be correct, the second annunciation image indicative of the above-mentioned fact is displayed (at the step S160, and see FIG. 6), and the inputtable numeric values into the next digit are displayed as the input assistance image (at the step S170, and see FIG. 7). Thereafter, the value n is increased by one to be updated (step S180), and then it is determined whether three numeric values for all digits of the channel number are completely input or not (step S190). When the numeric values for all digits have already been input, a search operation for the channel number designated is started (step S200). If the numeric values for all digits have not been input yet, a next numeric value for the next digit will also be subjected to the processing at the steps S110 to S180.

(3) Various Modified Examples

Although in the above-mentioned embodiments the inputtable numeric values into one digit are simply displayed in ascending order when displaying the input assistance image, the invention is not limited thereto. In the invention, the numeric values which have been entered before may be stored, and the inputtable numeric values for the one digit may be arranged and displayed in decreasing or increasing order of the number of inputs. In addition, any one of the inputtable numeric values displayed may be selected using a cross-shaped key of the remote controller or the like.

Although in the embodiments described above, the invention is applied to the television receiving tuner, the invention is not limited thereto. The invention may be applied to a television receiver having the function of the television receiving tuner as described in the above embodiments, and including a display for displaying the image based on the video signal output.

(4) Conclusion

As can be seen from the above descriptions, in the television receiving tuner 10 according to the exemplary embodiments, it is determined whether or not the numeric value input into one digit corresponds to any one of a plurality of channel numbers stored in the channel number data 28d1 in designation of the channel number, based on the numeric value input into the one digit, the numeric value(s) already input into another or other digits, and the inputtable numeric value list 28d2. If the value input does not correspond to the channel number stored, the first annunciation image is displayed for announcing the inputting error of the channel number to the user, thereby eliminating the necessity of reentering all digits of the channel number many times, resulting in smooth designation of the channel number. Since the inputting error is informed before the numeric values for all digits are completely entered, a search operation based on a wrong channel number is avoided.

I claim:

1. A television receiving tuner including a channel number storage section for storing therein a channel number having a plurality of digits, the television receiving tuner being adapted to receive a television broadcast radio wave in a frequency band corresponding to the channel number designated, the television receiving tuner comprising:

a digit determination section for determining whether or not a numeric value input, or each of the numeric values currently and previously input is identical to a numeric value at the corresponding digit of the channel number stored in the channel number storage section when the numeric value for any one of the digits is input in designation of the channel number; and a first announcing section for announcing an inputting error of the channel number when the numeric value input, or each of the numeric values currently and previously input is determined not to be identical to the numeric value at the corresponding digit of the channel number stored in the channel number storage section by the digit determination section;

the television receiving tuner comprises a tuner section, a digital reproduction section including a digital I/F, a demodulator circuit, a descrambling section, a demultiplex section, and a MPEG decoder, a video output section for converting a digital video signal generated by the MPEG decoder into an analog video signal, a D/A converter for converting a digital audio signal generated by the MPEG decoder into an analog audio signal, and an audio output section for outputting the analog audio signal, the MPEG decoder includes an OSD processor, and displays an image with a predetermined still screen superimposed thereon, or replaces an image by a predetermined still image to display the image;

the television receiving tuner includes a CPU, a ROM, and an EEPROM which are connected to a bus, and the CPU reads a program stored in the ROM into the RAM, while executing control processing by use of channel number data stored in the EEPROM, using the RAM as a work area;

the CPU is adapted to read the inputtable numeric value at a third step, and then to determine whether or not the numeric value input is identical to the inputtable numeric value at a fourth step, when the input value is determined not to be identical to the inputtable numeric value, the CPU displays an image indicative of the inputting error of the channel number as the first announcing image at a sixth step, and an image instructing a user to input again another numeric value for the n-th digit, and then accepts entry of the another numeric value at a eight step to cause an operation of the tuner to return to a second step, where the CPU stands by until the another numeric value is input, when the input value is determined to be identical to the inputtable numeric value, the CPU displays an image indicating that the numeric value input into the n-th digit is identical to the inputtable numeric value and that inputting of the numeric value into the n-th digit is correct, as the second annunciation image at a fifth step, and an input assistance image so as to indicate the inputtable numeric value into a (n+1)-th digit after the numeric value for the n-th digit is input, the input assistance image having an image indicative of the numeric value already input into the n-th digit at an upper part thereof, and a list of the inputtable numeric values into the next (n+1)-th digit at a lower part thereof at a seventh step, and the CPU increases a value n indicative of a digit order by one to update the value at a ninth step, and determines whether or not the value n is larger than the number of digits of the channel number (n> the number of digits of the channel number) at a tenth step, and when the value n is not larger than the number of digits of the channel number (if not n> the number of digits of the channel number), the CPU causes the operation to return to the second step, and when the value n is larger than the number of digits of the channel number (if n> the number of digits of the channel number), it is determined that inputting of all the digits is normally performed, and a search for the channel number designated is performed.

* * * * *